(12) United States Patent
Qin et al.

(10) Patent No.: US 8,841,190 B2
(45) Date of Patent: Sep. 23, 2014

(54) MOS DEVICE FOR MAKING THE SOURCE/DRAIN REGION CLOSER TO THE CHANNEL REGION AND METHOD OF MANUFACTURING THE SAME

(75) Inventors: Changliang Qin, Beijing (CN); Huaxiang Yin, Beijing (CN)

(73) Assignee: The Institute of Microelectronics Chinese Academy of Science, Beijing (CN)

( * ) Notice: Subject to any disclaimer, the term of this patent is extended or adjusted under 35 U.S.C. 154(b) by 133 days.

(21) Appl. No.: 13/519,884

(22) PCT Filed: Apr. 10, 2012

(86) PCT No.: PCT/CN2012/000476
§ 371 (c)(1),
(2), (4) Date: Jun. 28, 2012

(87) PCT Pub. No.: WO2013/143035
PCT Pub. Date: Oct. 3, 2013

(65) Prior Publication Data
US 2013/0256664 A1    Oct. 3, 2013

(30) Foreign Application Priority Data

Mar. 30, 2012    (CN) .......................... 2012 1 0089963

(51) Int. Cl.
*H01L 29/872*    (2006.01)

(52) U.S. Cl.
USPC ........... 438/289; 438/285; 438/700; 438/478; 438/682; 257/348; 257/255; 257/288; 257/347; 257/741; 257/E21.296; 257/E23.157; 257/E29.242; 257/E21.634; 257/E21.417

(58) Field of Classification Search
CPC ..................... H01L 29/66636; H01L 29/7848; H01L 29/66628; H01L 29/7833
USPC ........... 257/348, E27.112, E21.417, E21.444; 438/289, 294
See application file for complete search history.

(56) References Cited

U.S. PATENT DOCUMENTS 7,994,062 B2    8/2011 Wojtczak et al.
2003/0190766 A1*   10/2003 Gonzalez et al. ............... 438/57
(Continued)

FOREIGN PATENT DOCUMENTS

| CN | 1738056 A | 2/2006 |
|---|---|---|
| CN | 1902736 A | 1/2007 |

(Continued)

*Primary Examiner* — Jerome Jackson, Jr.
*Assistant Examiner* — Bo Fan
(74) *Attorney, Agent, or Firm* — Treasure IP Group

(57) ABSTRACT

This invention relates to a MOS device for making the source/drain region closer to the channel region and a method of manufacturing the same, comprising: providing an initial structure, which includes a substrate, an active region, and a gate stack; performing ion implantation in the active region on both sides of the gate stack, such that part of the substrate material undergoes pre-amorphization to form an amorphous material layer; forming a first spacer; with the first spacer as a mask, performing dry etching, thereby forming a recess, with the amorphous material layer below the first spacer kept; performing wet etching using an etchant solution that is isotropic to the amorphous material layer and whose etch rate to the amorphous material layer is greater than or substantially equal to the etch rate to the {100} and {110} surfaces of the substrate material but is far greater than the etch rate to the {111} surface of the substrate material, thus removing the amorphous material layer below the first spacer, such that the substrate material below the amorphous material layer is exposed to the solution and is etched thereby, and in the end, forming a Sigma shaped recess that extends to the nearby region below the gate stack; and epitaxially forming SiGe in the Sigma shaped recess.

11 Claims, 5 Drawing Sheets

(56) References Cited

U.S. PATENT DOCUMENTS

| | | | |
|---|---|---|---|
| 2013/0009245 A1* | 1/2013 | Chang et al. | 257/348 |
| 2013/0316509 A1* | 11/2013 | Qin et al. | 438/289 |

FOREIGN PATENT DOCUMENTS

| | | | |
|---|---|---|---|
| CN | 1945854 A | 4/2007 |
| CN | 101097955 A | 1/2008 |
| CN | 102165571 A | 8/2011 |
| CN | 102201335 A | 9/2011 |
| CN | 102282657 A | 12/2011 |
| CN | 102376575 A | 3/2012 |

* cited by examiner

US 8,841,190 B2

MOS DEVICE FOR MAKING THE SOURCE/DRAIN REGION CLOSER TO THE CHANNEL REGION AND METHOD OF MANUFACTURING THE SAME

CROSS REFERENCE

This application is a National Phase application of, and claims priority to, PCT Application PCT/CN2012/000476, filed on Apr. 10, 2012, entitled 'MOS device for making the source/drain region closer to the channel region and a method of manufacturing the same', which claimed priority to Chinese Application No. 201210089963.4, filed on Mar. 30, 2012. Both the PCT Application and Chinese Application are incorporated herein by reference in their entireties.

FIELD OF THE INVENTION

This invention relates to the field of semiconductors, and in particular, to a MOS device for making the source/drain region closer to the channel region and a method of manufacturing the same.

BACKGROUND OF THE INVENTION

Entering 90 nm nodes, the strained silicon technique becomes a basic technique for improving MOSFET device performance by repressing short channel effect and increasing carrier mobility, wherein the following stress techniques are put forward, such as shallow trench isolation (STI) technique, stress proximity technique (SPT), source/drain region embedded SiGe technique, metal gate stress technique, and contact etch stop layer (CESL) technique.

At stages of 90 nm and 65 nm, for the PMOS source/drain region embedded SiGe technique employs a method that comprises such steps as performing dry etching to the source/drain region and then epitaxially growing SiGe in the resultant recess to provide the channel with a compressive stress thereby improving the performance of the PMOS. At stages 45 nm and 32 nm, a change is made to the etching of the source/drain region, i.e., using the spacer as a mask, first performing dry etching to the source/drain region to form a recess (as shown in FIG. 6a), then performing wet etching to the recess obtained from the above dry etching through such solutions as tetramethylammonium hydroxide (TMAH) to further form a Sigma shaped recess, as shown in FIG. 6b, wherein the bottom surface of the Sigma shaped recess is a {100} surface, whereas two inclined planes are a {111} surface, the start point of the {111} surface in FIG. 6b is substantially aligned with the outer edge of the spacer. Next, SiGe (e-SiGe) is epitaxially grown in the Sigma shaped recess. However, in the above method of forming a Sigma shaped recess, because it is necessary to perform dry etching to the source/drain region to form a deeper recess first, it is usually a requirement that the corresponding masking spacer should be fairly thick. Therefore, even if TMAH solution is employed thereafter to perform wet etching, because the etching start point is at the outer edge of the masking spacer, the Sigma shaped recess is relatively farther away from the channel. As a result, it is difficult to further improve the performance of the PMOS device.

SUMMARY OF THE INVENTION

To solve the above problem, this invention brings forward a MOS device for making the source/drain region closer to the channel region and a method of manufacturing the same. Through this invention, the intersection where the two {111} surfaces of the Sigma shaped recess meet is closer to the channel, thereby introducing greater stress thereto.

Therefor, this invention relates on one hand to a method of manufacturing a PMOS device, the method comprising the following steps: providing an initial structure, which includes a substrate, an active region having a channel region and formed in the substrate, and a gate stack formed above the channel region; performing ion implantation in the active region on both sides of the gate stack, such that part of the substrate material undergoes pre-amorphization to form an amorphous material layer; forming a first spacer on both sides of the gate stack; with the first spacer as a mask, performing self-aligned dry etching, thereby forming a recess, with the amorphous material layer below the first spacer kept; performing wet etching using an etchant solution that is isotropic to the amorphous material layer and whose etch rate to the amorphous material layer is greater than or substantially equal to the etch rate to the {100} and {110} surfaces of the substrate material but is far greater than the etch rate to the {111} surface of the substrate material, thus quickly removing the amorphous material layer below the first spacer, such that the substrate material below the amorphous material layer is exposed to the solution and is etched thereby, and in the end, forming a Sigma shaped recess that extends to the nearby region below the gate stack; and epitaxially forming SiGe in the Sigma shaped recess.

This invention relates on the other hand to a method of manufacturing a CMOS device, the method comprising steps of using the above method to form a PMOS and using a conventional method to form a NMOS.

A further aspect of this invention relates to a PMOS device, comprising: a substrate; an active region having a channel region and formed in the substrate; and a gate stack formed above the channel region; a first spacer formed on both sides of the gate stack; an amorphous material layer formed in the active region on both sides of the gate stack, the amorphous material layer causing a Sigma shaped recess, which is formed by wet etching using an etchant solution that is isotropic to the amorphous material layer and whose etch rate to the amorphous material layer is greater than or substantially equal to the etch rate to the {100} and {110} surfaces of the substrate material but is far greater than the etch rate to the {111} surface of the substrate material, to extend to the nearby region below the gate stack, thereby enabling SiGe formed epitaxially in the Sigma shaped recess to introduce a compressive stress greater than that introduced by a conventional process to the channel region.

A still further aspect of this invention relates to a CMOS device, which comprises the above PMOS and a conventional NMOS.

BRIEF DESCRIPTION OF THE DRAWINGS

Through a description of the embodiments of this invention with reference to the following figures, the above and other purposes, features and advantages of this invention will become clearer. In the figures.

It should be noted that the figures of this invention are not drawn in scale, but are merely for the purpose of illustration, so shall not be interpreted as any limitation and constraint to the scope of this invention. In these figures, similar components are identified by similar reference signs.

DETAILED DESCRIPTION OF THE PREFERRED EMBODIMENTS

This invention is described through the embodiments illustrated in the figures. It should be understood that these descriptions are schematic instead of intending to limit the scope of this invention. Besides, in the following descriptions, the description of common structures and techniques is omitted in order to avoid unnecessary confusion with the idea of this invention.

The figures are schematic diagrams showing the layer structures of the embodiments of this invention. They are not drawn in scale, and wherein, for the sake of clarity, some details are amplified, and some are omitted. The various types of regions, shapes of layers and the relative sizes and positional relations between them, as shown in the figures, are only schematic. In reality, there might be deviations due to manufacturing tolerance or technical limitation. Besides, a person having ordinary skill in the art, on the basis of actual needs, may otherwise design a region/layer having a different shape, size and relative position.

Embodiment 1

Application of this Invention in Gate-Last PMOS Device

Figure 1A:
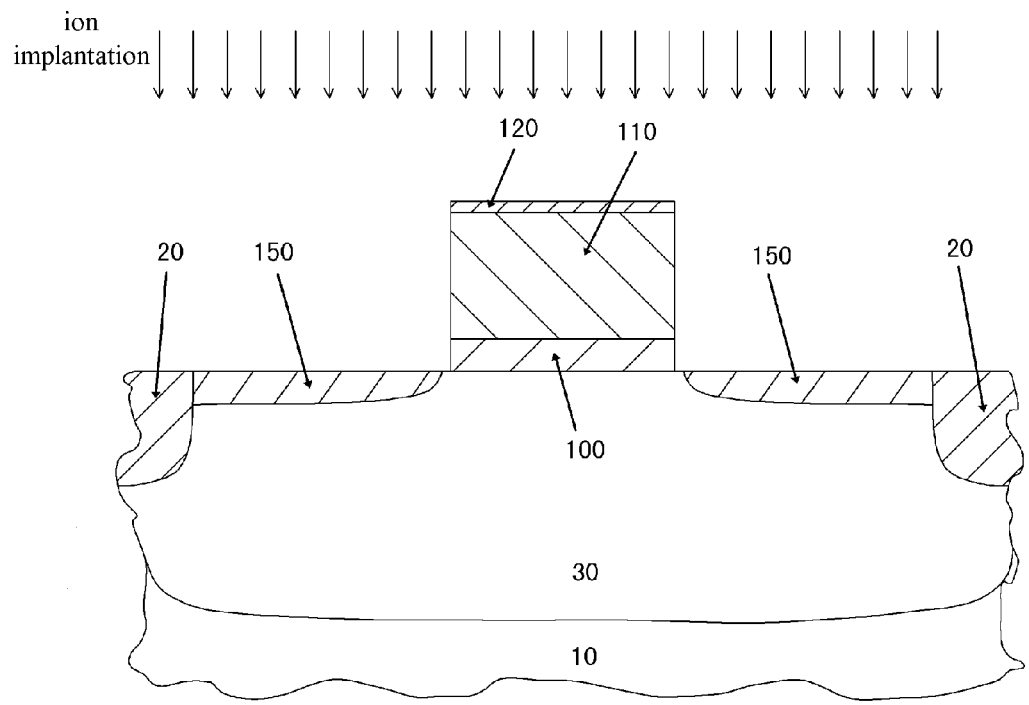
FIGS. 1a-b, 2-5 are cross-sectional views of device structures formed by this invention at different stages.

In FIG. 1a, a substrate 10 is provided, and the substrate 10 may be a conventional silicon substrate or a silicon-on-insulator (SOI) substrate. The substrate may have an arbitrary thickness, as long as its mechanical strength is enough to support the chip. Besides, the substrate may be applied with a stress, not be applied with a stress or may comprise a strain region or an unstrained region therein.

After the substrate 10 is provided, preferably, isolation regions 20, as shown in the figure, is formed in the substrate 10 by the conventional technique well known in this field, the isolation regions being, e.g., shallow trench isolation (STI) region, or a field isolation region, and besides, the material of the isolation regions may be a material having stress or a material having no stress.

An active region 30 is formed by implantation into the substrate between the isolation regions 20, wherein the active region below the gate to be formed acts as a channel region.

Thereafter, a gate stack is formed to act as a sacrifice gate, wherein the gate stack comprises a gate dielectric layer 100 formed above the channel region and a gate conductor 110 formed above the gate dielectric layer 100, and preferably there might be a cap layer 120 formed above the gate conductor 110. The material of the gate dielectric layer 100 may comprise a low-K dielectric constant material and a high-K dielectric constant material, wherein the low-K dielectric constant material, for example, is at least one of $SiO_2$, SiON, or $Si_3N_4$; the high-K dielectric constant material may be selected from one of the following materials and/or combinations thereof, and/or multilayer structures thereof: $Al_2O_3$; hafnium-based high-K dielectric material comprising at least one of $HfO_2$, HfSiOx, HfSiON, HfAlOx, HfTaOx, HfLaOx, HfAlSiOx, or HfLaSiOx; and rare-earth based high-K dielectric material comprising at least one of $ZrO_2$, $La_2O_3$, $LaAlO_3$, $TiO_2$, or $Y_2O_3$. The material of the gate conductor 110 may comprise any type of conductive materials, including but not limited to polycrystalline silicon, metal or metal alloy, silicide, conductive nitride, polycrystalline SiGe and combinations thereof. The material of the cap layer 120, for example, is an oxide, nitride or other insulating medium. In the gate-last process, they will be removed in the following steps, so the selected materials are not important, as long as they are compatible with the MOS process.

The method of forming the gate stack is first depositing one by one a gate dielectric layer 100, a gate conductor layer 110, and preferably a cap layer 120, then etching the above structure. The depositing process includes but is not limited to chemical vapor deposition (CVD), plasma-assisted deposition (PACVD), atomic layer deposition (ALD), evaporation, reactive sputtering, chemical solution deposition or other similar depositing process. The etching process includes but is not limited to reactive ion etching (RIE).

After the gate stack is formed, preferably, in order to improve the device performance, a source/drain extension (SDE) region (not shown) is formed using the lightly doped drain (LDD) process in the active region (the position intended to form the source/drain) on both sides of the gate stack. Besides, in order to prevent the source/drain punch through, it is preferable to perform Halo implantation next.

The step of forming the above source/drain extension (SDE) region and performing Halo implantation may also be carried out after the following step of forming SiGe in the Sigma shaped recess. This will be discussed later.

Next, ion implantation is performed in the active region on both sides of the gate stack such that part of the substrate material undergoes pre-amorphization to form an amorphous material layer 150, as shown in FIG. 1a.

The ion selected by the ion implantation includes but is not limited to one or more than one of boron (B), carbon (C), nitrogen (N), aluminum (Al), silicon (Si), phosphor (P), gallium (Ga), germanium (Ge), arsenic (As), indium (In), stannum (Sn), tellurium (Te), plumbum (Pb) and inert gas particles.

Figure 1B:
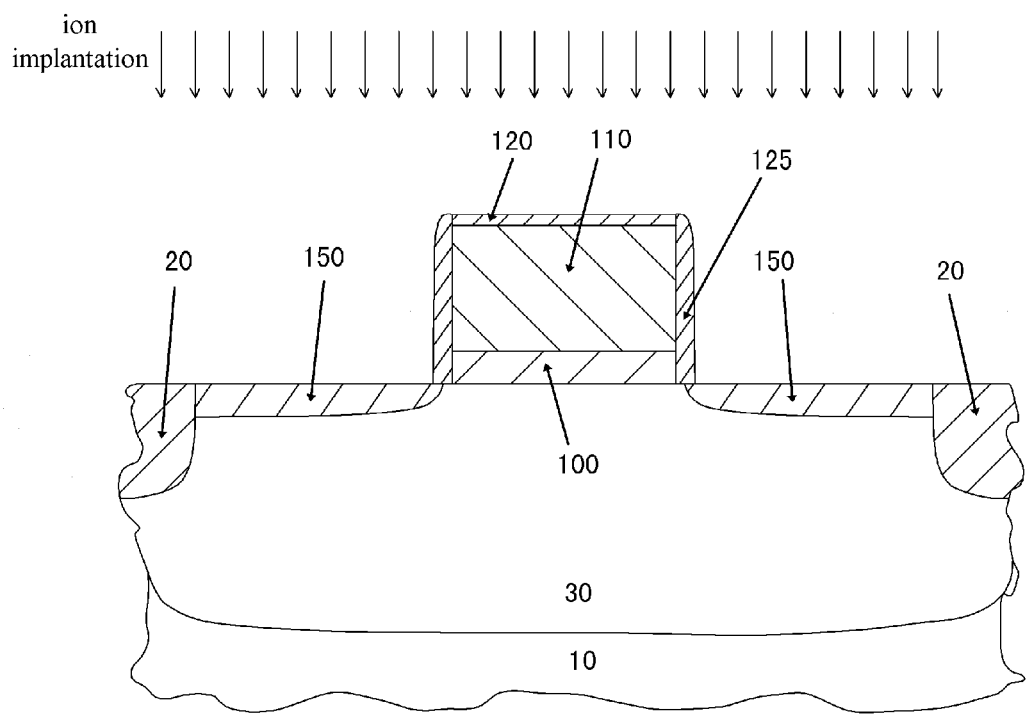

Preferably, in order to protect the gate stack, a spacer 125 is first formed on both sides of the gate stack, thereafter it is used as a mask to perform ion implantation, as shown in FIG. 1b. The material of the spacer 125 includes but is not limited to nitride or oxynitride. The thickness of the spacer 125 is about 10 nm. The formation of the spacer may be implemented by first depositing a material suitable for the spacer and having it etched. The spacer 125 may also be formed before the above LDD processing step. This is well known to a person having ordinary skill in the art, and will not be discussed here again.

Figure 2:
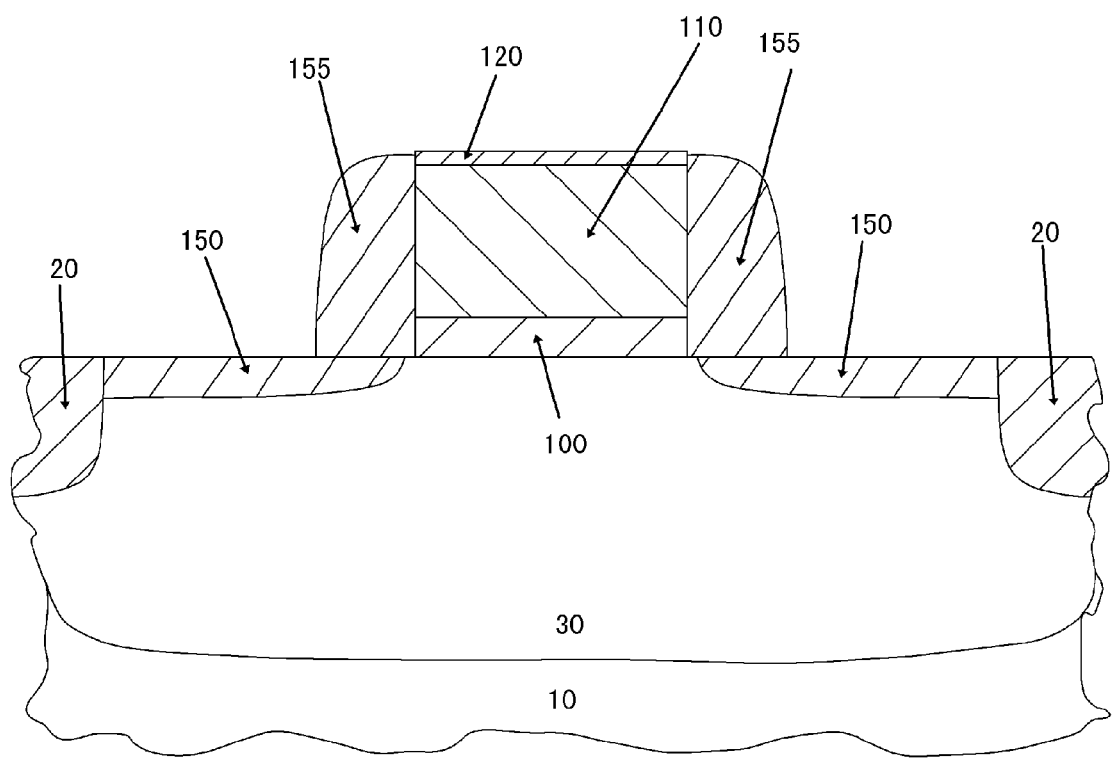

Next, on both sides of the gate stack, or on both sides of the spacer 125 (if any), a spacer 155 is formed, as shown in FIG. 2. The material of the spacer 155 includes but is not limited to nitride or oxynitride. The spacer 155 is fairly thick, with a range of about 10-500 nm, and preferably 50-100 nm.

Figure 3:
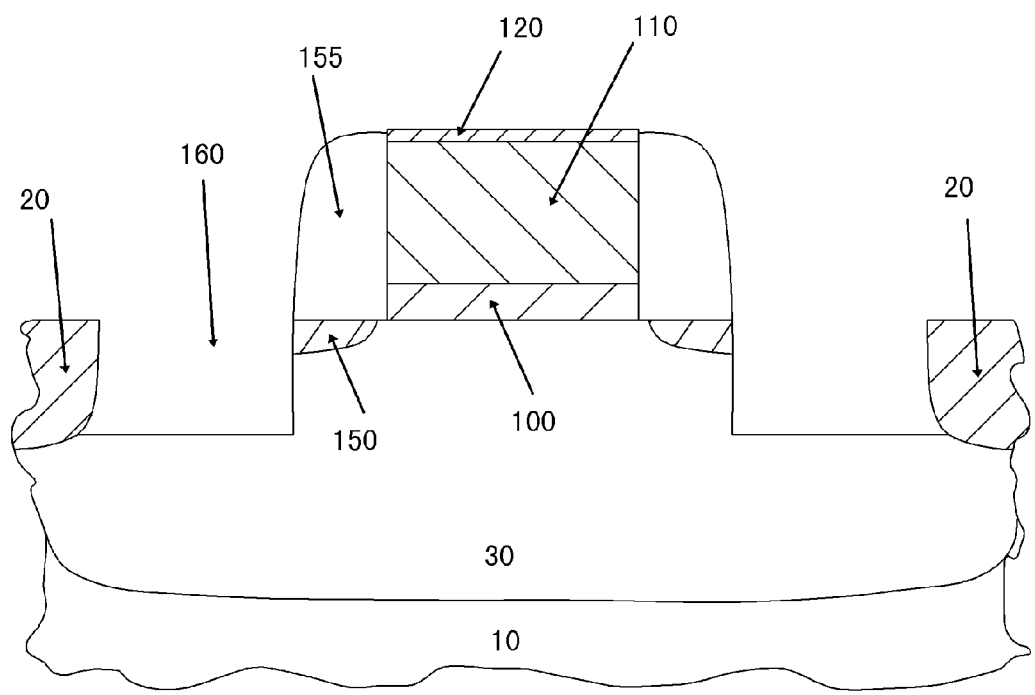

Next, the spacer 155 is used as a mask, the amorphous material layer 150 outside the spacer 155 is removed by self-aligned dry etch, and then the substrate material with a certain thickness below is also removed, thereby forming a recess 160, as shown in FIG. 3. The depth of the recess 160 is controlled within the range between about 1 nm to about 10 μm, preferably within the range between about 5 nm to about 1 μm, and more preferably, within the range between about 10 nm to about 100 nm. It can be seen from FIG. 3 that the amorphous material layer 150 below the spacer 155 is not removed.

Thereafter, wet etching is performed, which uses an etchant solution that is isotropic to the amorphous material layer and whose etch rate to the amorphous material layer is greater than or substantially equal to the etch rate to the {100} and {110} surfaces of the substrate material but is far greater than the etch rate to the {111} surface of the substrate material, wherein the term "substantially equal to" means that the two objects being compared are similar or comparable to each other, while the term "far greater than" means that the former is sufficiently larger than the latter, for example, is 3, 5 or 7 times the latter, even with a difference in the order of magnitude. The etchant solution satisfying such requirement is selected from one of the following groups: (1) tetramethylammonium hydroxide (TMAH) or tetraethylammonium hydroxide (TEAH); (2) mixed solution of TMAH or TEAH with isopropyl alcohol (IPA) (causing the etched surface to become smooth); (3) mixed solution of these solutions in (1) or (2) and surfactants. In a broader sense, the etchant solution that satisfies such requirement may be organic base or asymmetric phosphate salt described in the U.S. Pat. No. 7,994, 062B2, which is wholly incorporated herein as a reference.

Figure 4:
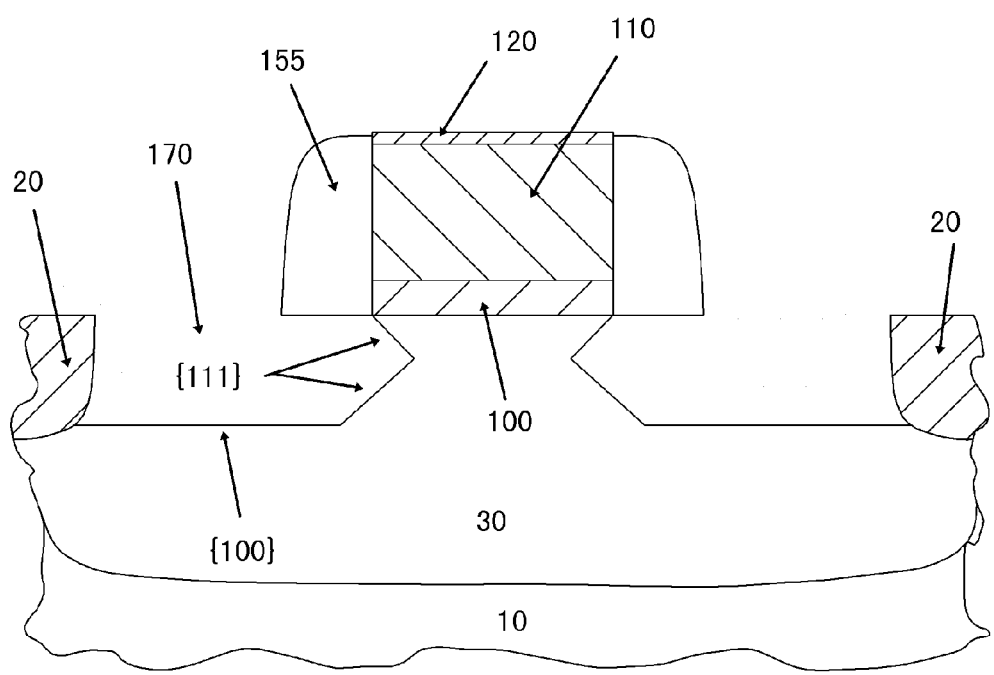
Figure 6A:
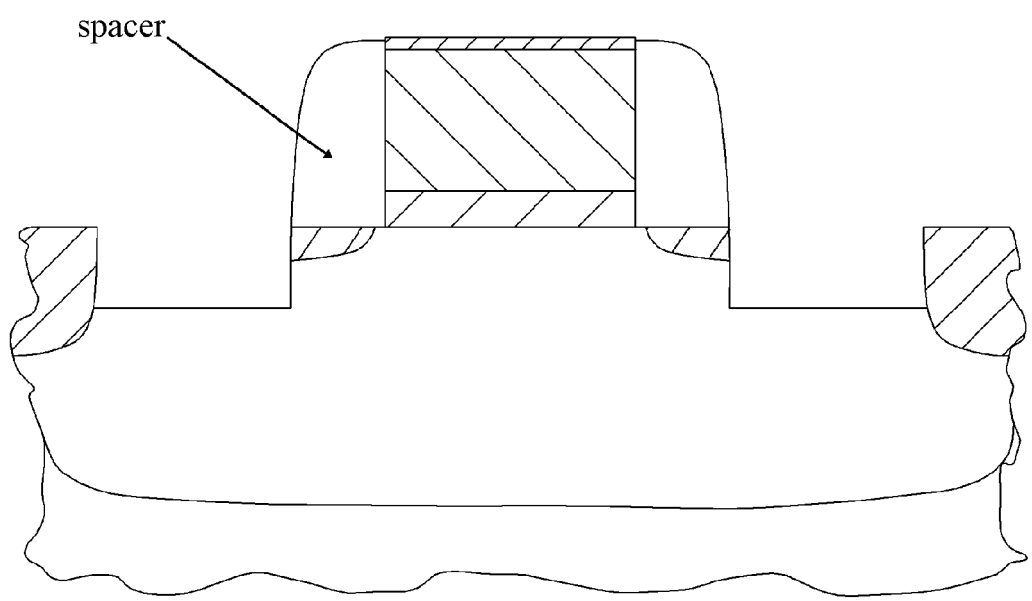
FIG. 6a-6b are cross-sectional views of device structures formed by the prior art.
Figure 6B:
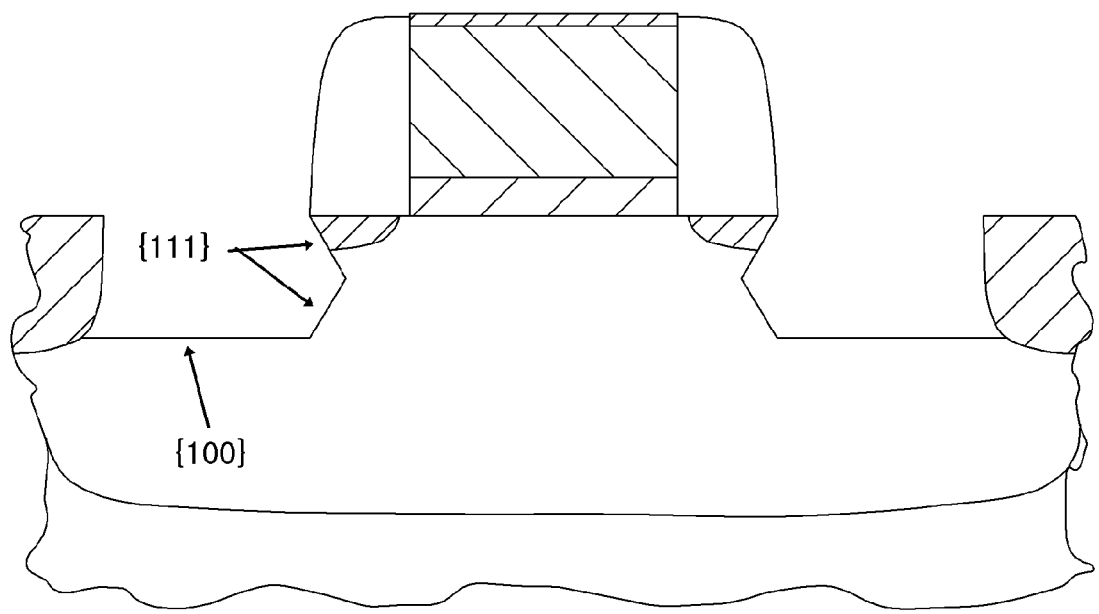

Wet etching is performed on the above etched recess 160 by TMAH or other solutions, thereby forming a Sigma shaped recess 170, as shown in FIG. 4. Because the above solution has an etching property of being isotropic to the amorphous material layer and its etch rate to the amorphous material layer is greater than the etch rate for such three families of crystal planes as {100}, {110}, {111} of the substrate material (e.g., TMAH's etch rate to the amorphous material is greater than that to the monocrystalline silicon {100}, {110}, {111} crystal planes, e.g., at a temperature of 80 degrees Celsius, the TMAH with a concentration of 25% has an etch rate greater than 5 µm/min to amorphous silicon), the solution quickly removes the amorphous material layer below the first spacer 155, causing the substrate material below the amorphous material layer to expose to the above solution and to be etched gradually, and in the end, forming a Sigma shaped recess 170 extending to the nearby region below the gate stack. It can be seen from FIG. 4 that the starting point for etching the substrate material (i.e., the starting point of the {111} surface near the upper surface of the Sigma shaped recess to be formed) is aligned substantially with the inner edge of the spacer 155, but in a conventional method (as shown in FIG. 6b), because the mask function of the first spacer prevents the monocrystalline silicon below the first spacer from contacting the TMAH solution, it cannot be etched away. The Sigma shaped recess 170 formed by the method of this invention is obviously closer to the channel region than the Sigma shaped recess formed by a conventional method. As a result, after epitaxially growing SiGe in the source/drain Sigma shaped recess, a greater compressive stress can be provided to the channel, thereby enhancing the hole mobility in the device channel, and in the end, improving the electrical property of the PMOS.

Figure 5:
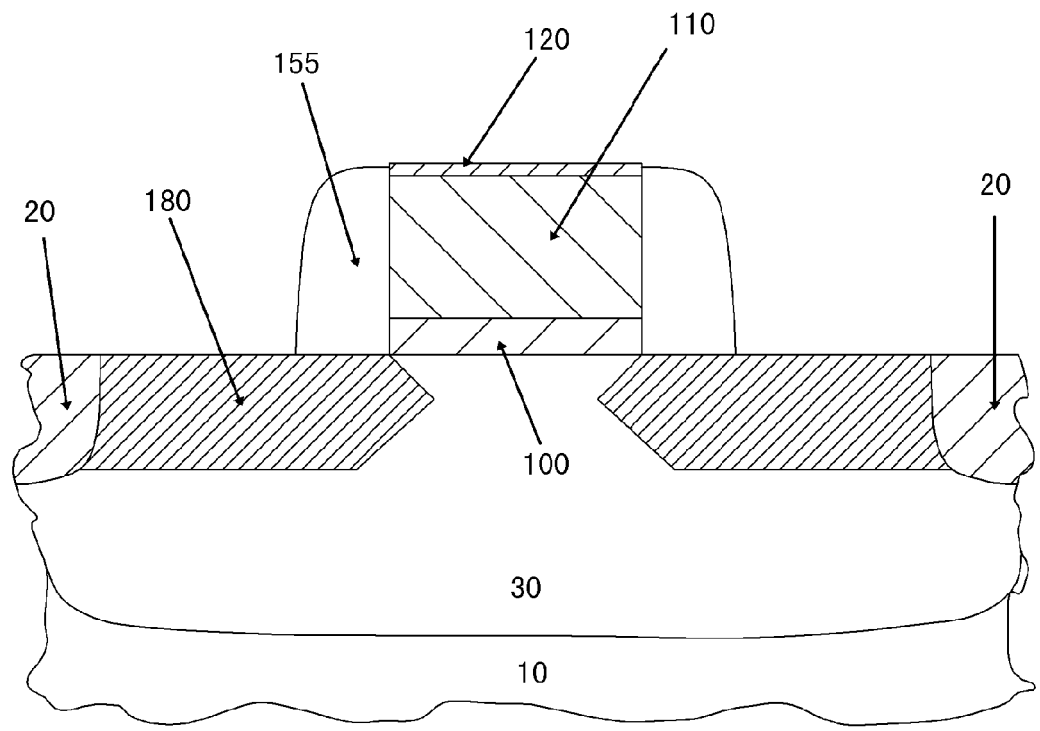

Next, as shown in FIG. 5, SiGe 180 is formed (e-SiGe) in the Sigma shaped recess 170, for example, by epitaxially growing SiGe doped with boron or phosphorus.

Next, silicide (not shown) is formed on the source/drain region by a conventional annealing process, including one of NiSi, PtSi, PtNiSi, SnSi, SnNiSi, TiSi, and CoSi, or combinations thereof.

If no LDD is performed to form SDE and no Halo implantation is performed in the previous step, and it is desirable to carry out the both steps, these steps may be performed after the step of forming the Sigma shaped recess 170 or after the step of forming SiGe 180 (e-SiGe), only that it is needed to first remove the spacer (e.g., spacer 125, 155) formed in the aforementioned step before performing LDD in the active region below the spacer to form SDE and perform Halo implantation, and then form another spacer again. This is not illustrated in drawings. Study found that doing so can further improve the device performance.

Next, a replacement gate is formed. The step of forming a replacement gate first removes the gate conductor 110, and preferably, in order to achieve better interface quality, the gate dielectric layer 100 is also removed. Next, a gate dielectric layer is formed again. The material of the gate dielectric layer may be selected from one of the following materials or a composite layer composed of combinations thereof: $Al_2O_3$; hafnium-based high-K dielectric material comprising at least one of $HfO_2$, HfSiOx, HfSiON, HfAlOx, HfTaOx, HfLaOx, HfAlSiOx, or HfLaSiOx; and rare-earth based high-K dielectric material comprising at least one of $ZrO_2$, $La_2O_3$, $LaAlO_3$, $TiO_2$, or $Y_2O_3$. The thickness of the newly formed gate dielectric layer is within the range of 0.1-10 nm, and preferably, within the range of 0.5-5 nm. Next, a metal gate 190 is formed. The material of the metal gate includes but is not limited to metal nitride, nitrogen doped metal silicide, and the like. The method of forming a metal gate includes but is not limited to physical sputtering, atomic layer deposition (ALD) or chemical vapor deposition (CVD).

Next, other following steps in the gate-last process are performed, including the formation of an interlayer dielectric layer and a metallic interconnect and the like, thereby completing the manufacturing of a high-K dielectric/metal gate PMOS device.

Embodiment 2

Application of this Invention in Gate-First PMOS Device

With respect to the manufacturing of a gate-first PMOS device, embodiment 2 differs from embodiment 1 only in that no sacrifice gate has to be formed after the formation of the channel region. Instead, a gate dielectric layer is directly formed above the channel region. The material of the gate dielectric layer may be selected from one of the following materials or a composite layer composed of combinations thereof: $Al_2O_3$; hafnium-based high-K dielectric material comprising at least one of $HfO_2$, HfSiOx, HfSiON, HfAlOx, HfTaOx, HfLaOx, HfAlSiOx, or HfLaSiOx; and rare-earth based high-K dielectric material comprising at least one of $ZrO_2$, $La_2O_3$, $LaAlO_3$, $TiO_2$, or $Y_2O_3$. The thickness of the gate dielectric layer is within the range of 0.1-10 nm, and preferably, within the range of 0.5-5 nm. Next, a metal gate is formed. The material of the metal gate includes but is not limited to metal nitride, metal nitrogen silicide, and the like. The method of forming a metal gate includes but is not limited to physical sputtering, atomic layer deposition (ALD) or chemical vapor deposition (CVD). In this way, the step of removing the sacrifice gate and remaking the gate stack is omitted naturally. This is well known to a person having ordinary skill in the art, and will not be discussed here again.

Embodiment 3

Application of this Invention in Conventional Low-K Dielectric/Polycrystalline Silicon or Polycrystalline SiGe Gate PMOS Device Embodiment 3 is identical with embodiment 2 except for the following differences: the material of the gate dielectric layer in the gate stack is a low-K dielectric constant material, such as being at least one of $SiO_2$, SiON, or $Si_3N_4$; and the material of the gate conductor is polycrystalline silicon or polycrystalline SiGe.

Embodiment 4

Application of this Invention in CMOS Device

The CMOS device in this embodiment is composed of the NMOS in the prior art and the PMOS made by the method involved in embodiment 1, 2 or 3.

In summary, this invention first forms at the source/drain region an amorphous material layer that is compatible with the conventional MOS process and is isotropic to an etchant solution, then etches it with the etchant solution, thereby making the point of intersection of the {111} surface of the Sigma shaped recess closer to a channel, thus being able to introduce greater stress to the channel.

The above description makes no extended explanation of such technical details as the etching and composition of each layer, but a person having ordinary skill in the art should understand that the desired shape of layers and regions can be formed by various means in the prior art. Besides, in order to form the same structure, a person having ordinary skill in the art may further design a method not identical with the method described above to explain this invention with reference to the embodiments thereof. However, these embodiments are merely for the purpose of illustrations, not for limiting the scope of this invention. The scope of this invention is limited by the appended claims and equivalents thereof. Without departing from the scope of this invention, a person having ordinary skill in the art is able to make various substitutions and modifications, but these substitutions and modifications shall all fall within the scope of this invention.

We claim:

1. A method of manufacturing a PMOS device, the method comprising the following steps:
    providing an initial structure, which includes a substrate, an active region having a channel region and formed in the substrate, and a gate stack formed above the channel region;
    performing ion implantation in the active region on both sides of the gate stack, such that part of the substrate material undergoes pre-amorphization to form an amorphous material layer;
    forming a first spacer on both sides of the gate stack;
    performing self-aligned dry etching, with the first spacer as a mask, thereby forming a recess, with the amorphous material layer below the first spacer remaining;
    performing wet etching using an etching solution that is isotropic to the amorphous material layer and whose etch rate to the amorphous material layer is greater than or equal to the etch rate to the {100} and {110} surfaces of the substrate material but is greater than the etch rate to the {111} surface of the substrate material, thus removing the amorphous material layer below the first spacer, such that the substrate material below the amorphous material layer is exposed to the solution and is etched thereby, and in the end, forming a Sigma shaped recess that extends to the active region below the gate stack; and
    epitaxially forming SiGe in the Sigma shaped recess.

2. The method according to claim 1, wherein the ion implantation is performed using one or more gas particles selected from B, C, N, Al, Si, P, Ga, Ge, As, In, Sn, Te, Pb and inert gases.

3. The method according to claim 1, wherein the etchant solution is selected from one of the following groups: (1) tetramethylammonium hydroxide (TMAH) or tetraethylammonium hydroxide (TEAH) solution; (2) a mixture of TMAH or TEAH with isopropyl alcohol (IPA); (3) mixtures of the solutions in (1) or (2) with at least one surfactant.

4. The method according to claim 1, wherein a second spacer is formed on both sides of the gate stack before performing ion implantation, the second spacer being used as a mask for protecting the gate stack during ion implantation, and wherein the first spacer surrounds the second spacer.

5. The method according to claim 1, wherein before performing ion implantation, a source/drain extension (SDE) region is formed using the lightly doped drain (LDD) process in the active region on both sides of the gate stack, and Halo implantation is performed.

6. The method according to claim 1, wherein the gate stack is a sacrifice gate and the method further comprises removing the sacrifice gate, and forming a replacement gate above the channel region, wherein the replacement gate comprises a high-K dielectric layer and a metal gate, the material of the metal gate is metal nitride or metal nitrogen silicide, the material of the high-K dielectric layer is selected from one of the following materials or a composite layer composed of a thereof: $Al_2O_3$; hafnium-based high-K dielectric material comprising at least one of $HfO_2$, HfSiOx, HfSiON, HfAlOx, HfTaOx, HfLaOx, HfAlSiOx, or HfLaSiOx; and rare-earth based high-K dielectric material comprising at least one of $ZrO_2$, $La_2O_3$, $LaAlO_3$, $TiO_2$, or $Y_2O_3$.

7. The method according to claim 1, wherein the gate stack comprises a high-K dielectric layer and a metal gate, the material of the metal gate is metal nitride or metal nitrogen silicide, the material of the high-K dielectric layer is selected from one of the following materials or a composite layer composed of a combination thereof: $Al_2O_3$; hafnium-based high-K dielectric material comprising at least one of $HfO_2$, HfSiOx, HfSiON, HfAlOx, HfTaOx, HfLaOx, HfAlSiOx, or HfLaSiOx; and rare-earth based high-K dielectric material comprising at least one of $ZrO_2$, $La_2O_3$, $LaAlO_3$, $TiO_2$, or $Y_2O_3$.

8. The method according to claim 1, wherein the gate stack comprises a low-K dielectric layer and a polycrystalline silicon or polycrystalline SiGe gate conductor, wherein the material of the low-K dielectric layer is one of $SiO_2$, SiON, and $Si_3N_4$, or a combination thereof.

9. A method of manufacturing a CMOS device, comprising a step of using the method of claim 6 to form a PMOS.

10. A method of manufacturing a CMOS device, comprising a step of using the method of claim 7 to form a PMOS.

11. A method of manufacturing a CMOS device, comprising of using the method of claim 8 to form a PMOS.

* * * * *